(12) United States Patent
Lee et al.

(10) Patent No.: US 8,802,571 B2
(45) Date of Patent: Aug. 12, 2014

(54) METHOD OF HARD MASK CD CONTROL BY AR SPUTTERING

(75) Inventors: Wonchul Lee, San Ramon, CA (US); Qian Fu, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 97 days.

(21) Appl. No.: 13/193,195

(22) Filed: Jul. 28, 2011

(65) Prior Publication Data
US 2013/0029491 A1 Jan. 31, 2013

(51) Int. Cl.
*H01L 21/311* (2006.01)

(52) U.S. Cl.
USPC ........... 438/696; 438/689; 438/694; 438/700; 438/702

(58) Field of Classification Search
USPC ..................... 438/689, 687, 694, 700–702
See application file for complete search history.

(56) References Cited

U.S. PATENT DOCUMENTS

| | | | |
|---|---|---|---|
| 4,916,511 A * | 4/1990 | Douglas | 257/301 |
| 5,837,615 A * | 11/1998 | Rostoker | 438/711 |
| 6,037,265 A | 3/2000 | Mui et al. | |
| 6,191,043 B1 | 2/2001 | McReynolds | |
| 6,277,756 B1 * | 8/2001 | Ohara et al. | 438/700 |
| 6,583,053 B2 * | 6/2003 | Lu et al. | 438/637 |
| 6,811,956 B1 | 11/2004 | Gabriel | |
| 6,903,026 B2 | 6/2005 | Han | |
| 2005/0048788 A1 | 3/2005 | Tang et al. | |
| 2007/0077755 A1 * | 4/2007 | Hong | 438/627 |

FOREIGN PATENT DOCUMENTS

TW 200478110 3/2002

OTHER PUBLICATIONS

S.Wolf et al. Silicon Processing for the VLSI Era, vol. 1, (Lattice Press) 1986, pp. 541.*

* cited by examiner

*Primary Examiner* — Duy Deo
*Assistant Examiner* — Maki Angadi
(74) *Attorney, Agent, or Firm* — Beyer Law Group LLP (57) ABSTRACT

A method for etching features into a silicon based etch layer through a patterned hard mask in a plasma processing chamber is provided. A silicon sputtering is provided to sputter silicon from the silicon based etch layer onto sidewalls of the patterned hard mask to form sidewalls on the patterned hard mask. The etch layer is etched through the patterned hard mask.

19 Claims, 6 Drawing Sheets

METHOD OF HARD MASK CD CONTROL BY AR SPUTTERING

BACKGROUND OF THE INVENTION

1. Field of the Invention

The invention relates to a method of forming semiconductor devices on a semiconductor wafer by etching an etch layer. More specifically, the invention relates to etching features into a silicon based etch layer.

2. Description of the Related Art

In etching a silicon based layer through a hard mask the sidewalls of the hard mask may erode, which increases the space CD of the features being etched, where the bar CD becomes smaller.

SUMMARY OF THE INVENTION

To achieve the foregoing and in accordance with the purpose of the present invention, a method for etching features into a silicon based etch layer through a patterned hard mask in a plasma processing chamber is provided. A silicon sputtering is provided to sputter silicon from the silicon based etch layer onto sidewalls of the patterned hard mask to form additional sidewalls on the patterned hard mask. The etch layer is etched through the patterned hard mask.

In another manifestation of the invention, a method for etching features into a silicon based etch layer through a patterned hard mask in a plasma processing chamber is provided. A silicon sputtering is provided to sputter silicon from the silicon based etch layer onto sidewalls of the patterned hard mask to form additional sidewalls on the patterned hard mask, comprising flowing a sputtering gas into the plasma processing chamber, wherein the sputtering gas comprises an argon gas and is etchant free, forming the sputtering gas into a plasma to generate argon ions, providing a bias greater than 200 volts that accelerates the argon ions in the plasma to the silicon based etch layer with sufficient energy to sputter silicon from the silicon based etch layer, and stopping the flow of the sputtering gas. The etch layer is etched through the patterned hard mask.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
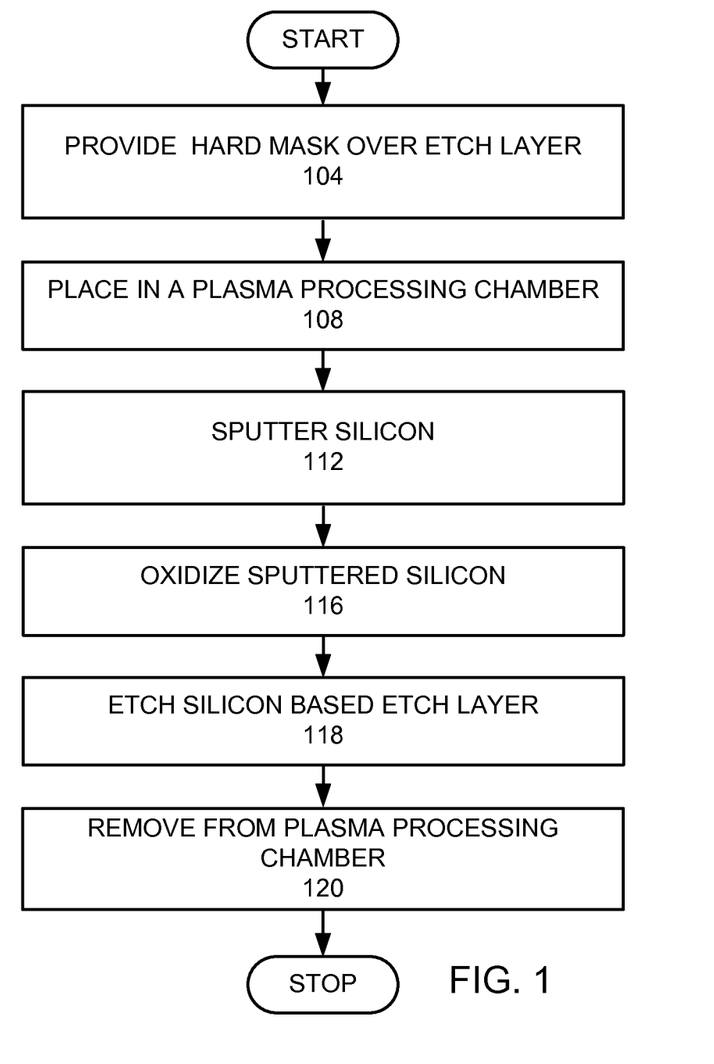
FIG. 1 is a flow chart of an embodiment of the invention.

FIG. 1 is a high level flow chart of an embodiment of the invention. In this embodiment, a patterned hard mask is formed over a silicon based etch layer (step 104). The silicon based etch layer may be part of a substrate, such as a silicon wafer or may be a layer over the substrate, such as a polysilicon layer formed over a silicon wafer. Silicon based etch layer is primarily silicon, such as crystalline silicon or polysilicon, or amorphous silicon, which may have a dopant. The silicon based etch layer is placed in a plasma processing chamber (step 108). The etch layer is subjected to a silicon sputtering (step 112). The silicon sputtering sputters silicon from the silicon based etch layers onto the sidewalls of the hard mask. The sputtered silicon is oxidized (step 116). The silicon based etch layer is etched (step 118). The substrate is removed from the plasma processing chamber (step 120).

Figure 2A:
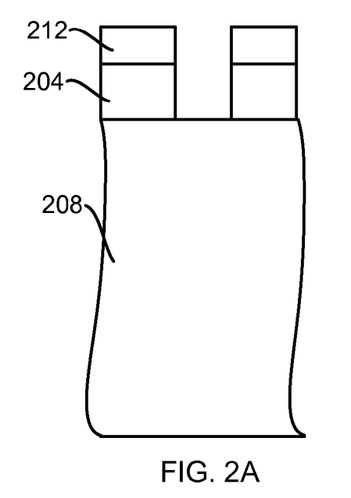
FIGS. 2A-D are schematic views of the formation of a feature using the inventive process.

In a preferred embodiment of the invention, a hard mask of silicon oxide is deposited over a silicon etch layer (step 104). In another embodiment, the hard mask is silicon nitride. FIG. 2A is a schematic cross-sectional view of a silicon etch layer 208, over which a patterned silicon oxide mask 204 has been formed. One or more intermediate patterning layers, may be disposed between the silicon etch layer 208 and the patterned silicon oxide hard mask 204. In addition, one or more layers may be above the hard mask 204 or below the etch layer 208. In this example, a polysilicon layer 212 is formed above the hard mask 204.

Figure 3:
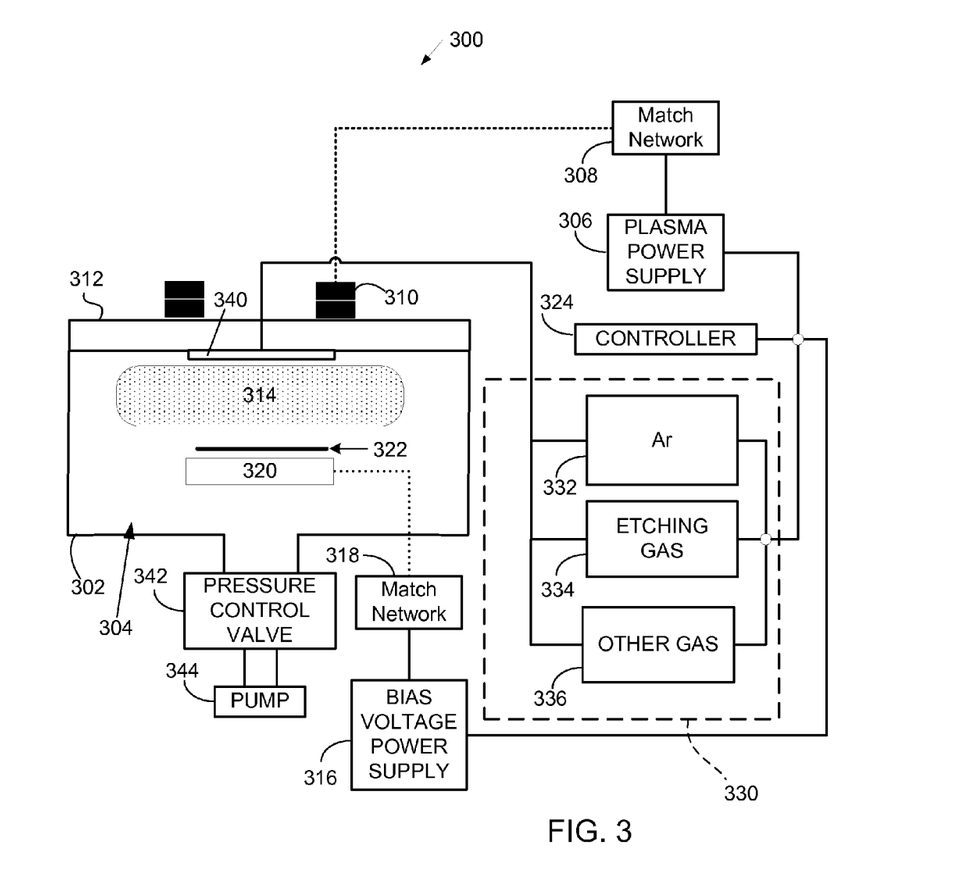
FIG. 3 is a schematic view of a plasma processing chamber that may be used in an embodiment of the invention.

The silicon based etch layer is placed in a processing tool (step 108). FIG. 3 schematically illustrates an example of a plasma processing system 300 which may be used to perform the process of etching a silicon wafer in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes argon gas source 332, an etching gas source 334, and optionally, an additional gas source 336. The gas sources 332, 334, and 336 are in fluid connection with processing chamber 304 through a gas inlet 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serves to maintain a particular pressure within the plasma processing chamber 304. The gas source/gas supply mechanism 330 is controlled by the controller 324. A Kiyo system by Lam Research Corporation may be used to practice an embodiment of the invention.

Figure 4:
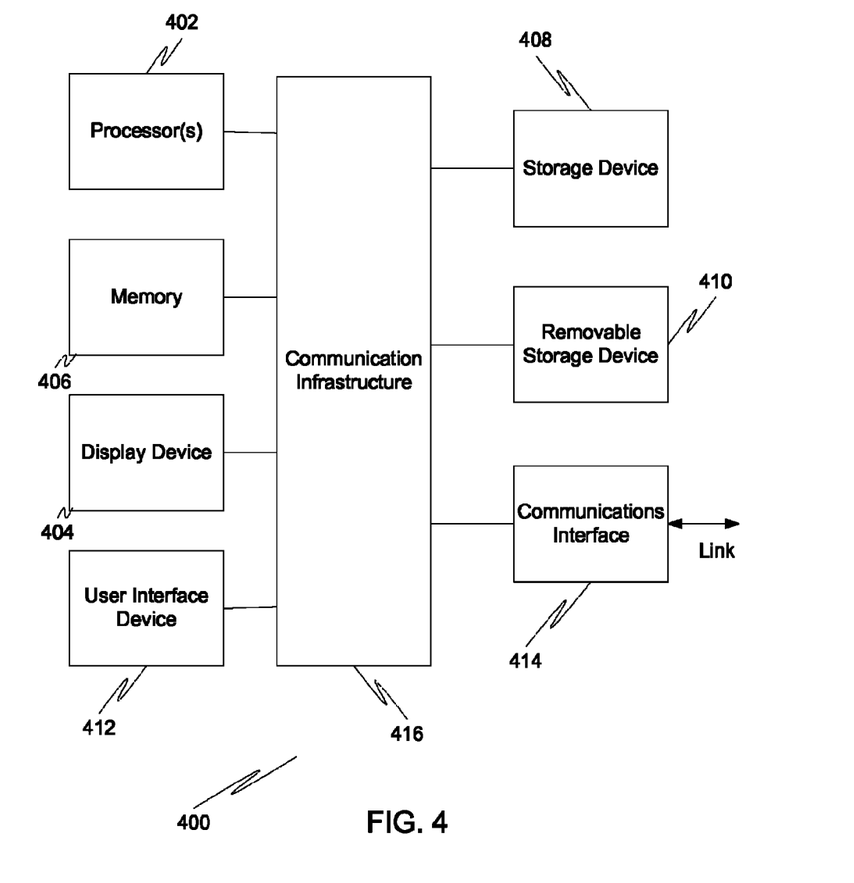
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this embodiment, the etch layer 208 is part of the wafer 322. In other embodiments, the etch layer 208 is a layer formed over the wafer 322.

Figure 2B:
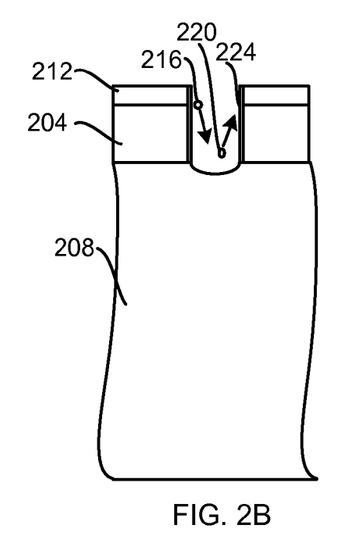
Figure 5:
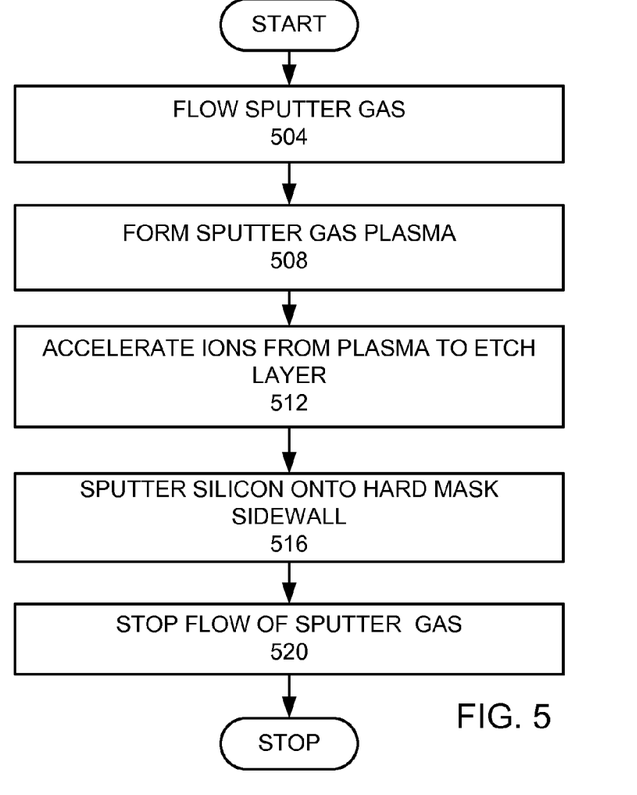
FIG. 5 is a more detailed flow chart of the silicon sputtering step.

A silicon sputter is provided to sputter silicon from the silicon based etch layer onto sidewalls of the hard mask (step 112) to form silicon sidewalls over the sidewalls of the hard mask. FIG. 5 is a more detailed flow chart of providing a silicon sputter. A sputter gas is flowed into the plasma processing chamber 304 (step 504). RF is provided to form the sputter gas into a plasma (step 508). A bias is provided to accelerate ions from the plasma from the sputter gas to the etch layer (step 512). The bias is high enough so that the ions cause silicon from the etch layer to be sputtered and redeposited on sidewalls of the hard mask (step 516). FIG. 2B is a cross-sectional view of the etch layer 208 and hard mask 204 schematically illustrating ions 216 that are accelerated to the etch layer 208, causing silicon 220 to be sputtered to form a silicon layer 224 over sidewalls of the hard mask 204. The flow of the sputter gas is stopped (step 520).

In this embodiment, the sputtered silicon is oxidized (step 116). In one embodiment, the oxidation is provided during the sputtering. For example, oxygen is added with the sputtering gas, so that during the sputtering process, the sputtering gas comprises Ar and oxygen, with other possible inert gases, all of which are etchant free in that none of these gases chemically etch a silicon based layer.

An example of a sputtering recipe where oxygen is added with the sputtering gas to provide oxidation during sputtering a pressure of 3 mTorr is provided. The gas source/gas supply mechanism 330 flows 100 sccm of Ar and 5 sccm $O_2$ into the plasma processing chamber 304. The plasma power supply 306 provides 440 Watts of RF power to the chamber to form the gas into a plasma. The wafer bias voltage power supply 316 provides 500 volts to the wafer 322, which accelerates the Ar ions to the wafer to cause sputtering.

In this embodiment, to provide sufficient sputtering, a bias of at least 200 volts is preferred. More preferably, the bias is between 400 to 1000 volts. Most preferably, the bias is about 500 volts.

In this embodiment, the sputtering gas consists essentially of Ar and oxygen. In other embodiments, other sputtering gas may have other noble gases, such as Ne, Xe, and He, which may be used with or in place of Ar. Therefore, the sputtering gas comprises a noble gas and oxygen. More preferably, the sputtering gas consists essentially of at least one noble gas and oxygen. More preferably, the sputtering gas consists essentially of Ar and oxygen. Most preferably, the sputtering gas is etchant free, since during the sputtering process only sputtering is used to provide sputtered silicon to form sidewalls. In such a case, chemical etching provided by an etchant would be undesirable. Such a sputtering gas would be at least 50% of a noble gas with the remaining being oxygen. More preferably, the sputtering gas is at least 90% of a noble gas and between 5% to 10% $O_2$. Test results have shown the effectiveness a sputtering gas of 95% Ar and 5% $O_2$.

Figure 6:
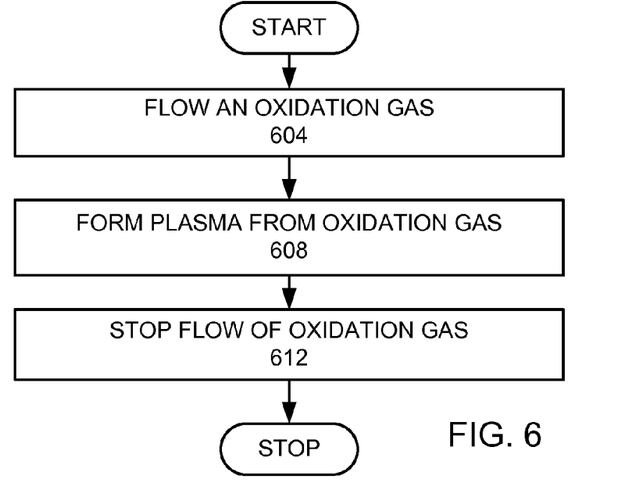
FIG. 6 is a more detailed flow chart of the oxidation step.

In another embodiment, the oxidation is provided after sputtering. FIG. 6 is a more detailed flow chart of oxidizing the sputtered silicon (step 116) after sputtering the silicon. An oxidation gas, such as oxygen, is flowed into the plasma processing chamber (step 604). The plasma formed from the oxidation gas (step 608) oxidizes the silicon sidewall to form silicon oxide. The flow of the oxidation gas is stopped (step 612).

An example of a sputtering recipe for this embodiment, where oxidation is performed after the sputtering, a pressure of 3 mTorr is provided. The gas source/gas supply mechanism 330 flows 100 sccm of Ar into the plasma processing chamber 304. The plasma power supply 306 provides 440 Watts of RF power to the chamber to form the gas into a plasma. The wafer bias voltage power supply 316 provides 500 volts to the wafer 322, which accelerates the Ar ions to the wafer to cause sputtering.

An example of an oxidation recipe for this embodiment, where oxidation is performed after the sputtering, a pressure of 20 mTorr is provided. The gas source/gas supply mechanism 330 flows 200 sccm of $O_2$ into the plasma processing chamber 304. The plasma power supply 306 provides 660 Watts of RF power to the chamber to form the gas into a plasma. The wafer bias voltage power supply 316 provides no bias voltage to the wafer 322, so that there is no acceleration of ions to the wafer.

In this embodiment, the sputtering gas consists essentially of Ar, and the oxidation gas in the subsequent oxidation step consists essentially of oxygen. In other embodiments, the sputtering gas may be the same as the sputtering gas discussed in previous paragraphs, but without any oxidation gas. The $O_2$ of the oxidation gas content could be low. Preferably, the oxidation gas would be at least 95% $O_2$. Preferably, the oxidation bias is less than 200 volts. More preferably, the oxidation bias is less than 100 volts. Most preferably, there is no bias voltage.

Figure 2C:
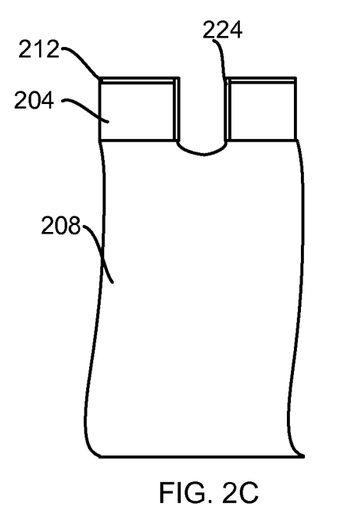

In another embodiment, the oxidation is not provided. FIG. 2C is a cross-sectional view of the etch layer 208 after the oxidation or in the embodiment without an oxidation after the sputtering is completed. In this embodiment, the silicon sputtering almost completely removes the polysilicon layer 212. In other embodiments, the polysilicon layer is completely removed. The sputtered silicon forms sidewalls 224 on the sides of the hard mask 204. When oxidation is provided, the sidewalls are silicon oxide 224. If oxidation is not provided, the sidewalls are silicon with possibly some ambient oxidation.

Figure 7:
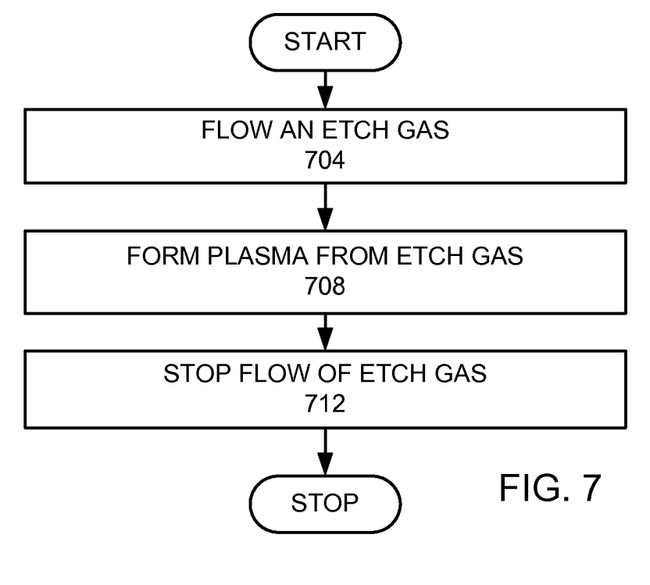
FIG. 7 is a more detailed flow chart of the etching the silicon based etch layer.

The silicon based etch layer is etched (step 118) using the hard mask and sidewalls as an etch mask. FIG. 7 is a more detailed flow chart of the etching the silicon based etch layer (step 118). An etch gas is flowed into the plasma processing chamber (step 704). The etch gas is formed into a plasma (step 708). The plasma from the etch gas is used to etch the silicon based etch layer. The flow of the etch gas is stopped (step 712).

An example of an etch recipe provides a pressure of 40 mTorr. The gas source/gas supply mechanism 330 flows 500 sccm HBr into the plasma processing chamber 304. The plasma power supply 306 provides 1000 Watts of RF power to the chamber to form the gas into a plasma. The wafer bias voltage power supply 316 provides 400 Volts to the wafer 322.

Figure 2D:
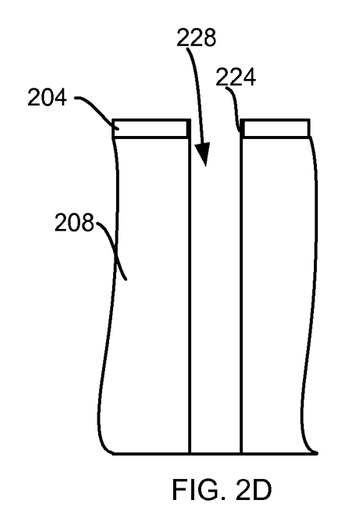

FIG. 2D is a cross-sectional view of the etch layer 208 after the etch is completed forming an etch feature 228. In this example, some of the hard mask 204 remains after the etch is completed. In other examples, the hard mask 204 may be completely removed during the etch. The sidewall 224 may also be etched back. In this example, some of the sidewall 224 remains, although in other embodiments the sidewall 224 may be completely removed.

Without forming a sputtered sidewall, an etch of silicon using a silicon oxide hard mask may trim the hard mask more than 1 to 2 nm causing the width of the etch feature space to increase by more than 2 to 4 nm during the etch. Such an increase in etch feature CD is not acceptable in certain cases. Forming sidewalls from a material that is too soft does not sufficiently prevent the increase in CD. It has been unexpectedly found that using Ar to sputter silicon from the etch layer prevents CD increase. In some embodiments, the sidewalls may be used to decrease the etch feature width. It has also been found that by providing oxidation the trimming is further reduced.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features into a silicon based etch layer through a patterned hard mask in a plasma processing chamber, comprising:
   providing a silicon sputtering to sputter silicon from the silicon based etch layer onto sidewalls of the patterned hard mask to form sidewalls on the patterned hard mask, wherein the silicon is sputtered primarily in the direction from the silicon based etch layer onto the sidewalls of the patterned hard mask; and
   etching the etch layer through the patterned hard mask.

2. The method, as recited in claim 1, wherein the providing the silicon sputtering comprises:
   flowing a sputtering gas into the plasma processing chamber, wherein the sputtering gas comprises a noble gas and is etchant free;
   forming the sputtering gas into a plasma to generate noble gas ions; and
   providing a bias that accelerates the noble gas ions in the plasma to the silicon based etch layer with sufficient energy to sputter silicon from the silicon based etch layer.

3. The method, as recited in claim 2, wherein the providing a bias provides a bias of greater than 200 volts.

4. The method, as recited in claim 2, wherein the sputtering gas consists essentially of at least one noble gas.

5. The method, as recited in claim 4, wherein the at least one noble gas comprises argon.

6. The method, as recited in claim 2, wherein the sputtering gas is at least 95% argon.

7. The method, as recited in claim 2, further comprising forming the sputtered silicon into silicon oxide.

8. The method, as recited in claim 7, wherein the forming the sputtered silicon into silicon oxide comprises:
   flowing oxygen into the plasma process chamber subsequent to providing the silicon sputtering and before etching the etch layer; and
   forming the oxygen into a plasma.

9. The method, as recited in claim 8, wherein the forming the sputtered silicon into silicon oxide, further comprises providing a bias of less than 200 volts.

10. The method, as recited in claim 7, wherein the forming the sputtered silicon into silicon oxide comprises flowing oxygen into the plasma process chamber during providing the silicon sputtering and before etching the etch layer.

11. The method, as recited in claim 10, wherein the sputtering gas consists essentially of at least one noble gas and oxygen.

12. The method, as recited in claim 11, wherein the at least one noble gas comprises argon.

13. The method, as recited in claim 12, wherein the sputtering gas is at least 95% argon.

14. The method, as recited in claim 10, wherein the sputtering gas consists essentially of 90% of at least one noble gas and the remaining consisting essentially of $O_2$.

15. The method, as recited in claim 14, wherein the at least one noble gas is argon.

16. The method, as recited in claim 1, wherein the silicon is sputtered primarily in the direction from the silicon based etch layer onto the sidewalls of the patterned hard mask.

17. A method for etching features into a silicon based etch layer through a patterned hard mask in a plasma processing chamber, comprising:
   providing a silicon sputtering to sputter silicon from the silicon based etch layer onto sidewalls of the patterned hard mask to form sidewalls on the patterned hard mask, wherein the silicon is sputtered primarily in the direction from the silicon based etch layer onto the sidewalls of the patterned hard mask, comprising:
   flowing a sputtering gas into the plasma processing chamber, wherein the sputtering gas comprises an argon gas and is etchant free;
   forming the sputtering gas into a plasma to generate argon ions;
   providing a bias greater than 200 volts that accelerates the argon ions in the plasma to the silicon based etch layer with sufficient energy to sputter silicon from the silicon based etch layer; and
   stopping the flow of the sputtering gas; and
   etching the etch layer through the patterned hard mask.

18. The method, as recited in claim 17, further comprising forming the sputtered silicon into silicon oxide.

19. The method, as recited in claim 17, wherein the sputtering gas consists essentially of 90% Ar.

* * * * *